United States Patent
Morikawa et al.

(10) Patent No.: US 9,570,685 B2
(45) Date of Patent: Feb. 14, 2017

(54) METHOD FOR FORMING PATTERN OF ORGANIC ELECTROLUMINESCENT ELEMENT

(71) Applicant: Konica Minolta, Inc., Tokyo (JP)

(72) Inventors: Masahiro Morikawa, Tokyo (JP); Hiroyuki Shindo, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/786,995

(22) PCT Filed: Apr. 16, 2014

(86) PCT No.: PCT/JP2014/060805
§ 371 (c)(1),
(2) Date: Oct. 26, 2015

(87) PCT Pub. No.: WO2014/175135
PCT Pub. Date: Oct. 30, 2014

(65) Prior Publication Data
US 2016/0087211 A1 Mar. 24, 2016

(30) Foreign Application Priority Data
Apr. 26, 2013 (JP) ................................. 2013-093265

(51) Int. Cl.
*H01L 51/00* (2006.01)
*H01L 51/56* (2006.01)
(Continued)

(52) U.S. Cl.
CPC ....... *H01L 51/0031* (2013.01); *H01L 51/0014* (2013.01); *H01L 51/0015* (2013.01);
(Continued)

(58) Field of Classification Search
CPC ...... H01L 51/00; H01L 51/50; H01L 51/0031; H01L 51/0015; H01L 51/56; H01L 51/0014; H01L 51/504; H01L 51/5036; H01L 51/5012; H05B 33/10
See application file for complete search history.

(56) References Cited

U.S. PATENT DOCUMENTS

| | | | |
|---|---|---|---|
| 2004/0179060 A1* | 9/2004 | Iwata | B41J 29/393 347/37 |
| 2012/0003448 A1* | 1/2012 | Weigel | B32B 17/10018 428/212 |
| 2012/0091482 A1* | 4/2012 | Uchida | H01L 27/3246 257/88 |

FOREIGN PATENT DOCUMENTS

| | | |
|---|---|---|
| CN | 101232081 A | 7/2008 |
| JP | 9-306669 A | 11/1997 |

(Continued)

OTHER PUBLICATIONS

International Search Report in corresponding application No. PCT/JP2014/060805 mailed Jul. 22, 2014 (2 pages).
(Continued)

*Primary Examiner* — Thanh T Nguyen
(74) *Attorney, Agent, or Firm* — Osha Liang LLP

(57) ABSTRACT

A method includes forming an emission pattern on an organic electroluminescent element including an organic functional layer between two electrodes by light irradiation to the organic electroluminescent element, and controlling at least one of light intensity and exposure time as variable factors during the light irradiation based on reciprocity failure characteristics involving modification of a function of the organic functional layer due to the light irradiation.

20 Claims, 5 Drawing Sheets

(51) Int. Cl.
*H01L 51/50* (2006.01)
*H05B 33/10* (2006.01)

(52) U.S. Cl.
CPC .............. *H01L 51/56* (2013.01); *H01L 51/00* (2013.01); *H01L 51/50* (2013.01); *H01L 51/504* (2013.01); *H05B 33/10* (2013.01)

(56) References Cited

FOREIGN PATENT DOCUMENTS

| | | |
|---|---|---|
| JP | 2007-12581 A | 1/2007 |
| JP | 2008-135306 A | 6/2008 |
| JP | 2009-535779 A | 10/2009 |
| JP | 2012-28335 A | 2/2012 |
| WO | 2012/086349 A1 | 6/2012 |

OTHER PUBLICATIONS

International Preliminary Report on Patentability issued in corresponding Application No. PCT/JP2014/060805, mailed on Nov. 5, 2015 (17 pages).
Office Action in corresponding Chinese Patent Application No. 201480022806.9 dated Jun. 17, 2016, with translation (15 pages).

* cited by examiner

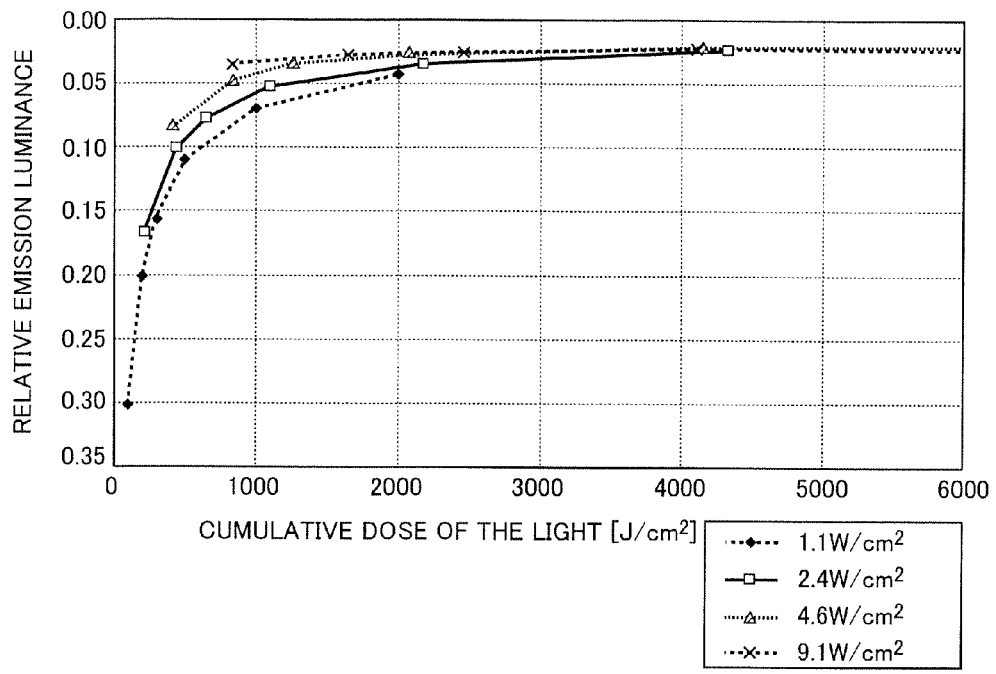
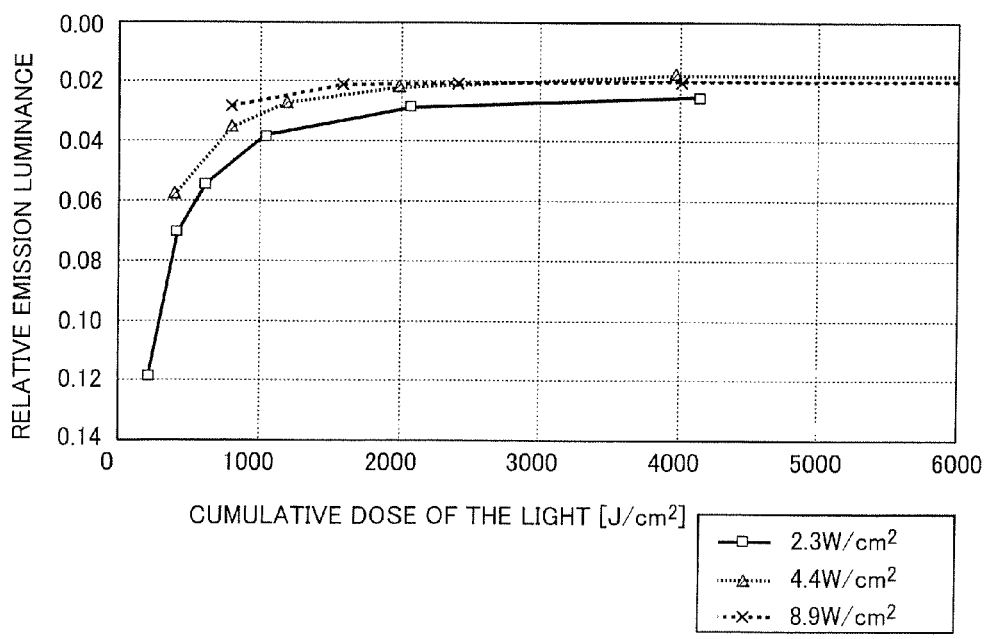

| GRADATION | BIT VALUE | RELATIVE EMISSION LUMINANCE | INTENSITY [W/cm²] | EXPOSURE TIME [ms] |
|---|---|---|---|---|
| BLACK | 0 | 0.1 | $D_{000}$ | $t_{000}$ |
| GRAY | 1 | 0.1035 | $D_{001}$ | $t_{001}$ |
| | 2 | 0.1071 | $D_{002}$ | $t_{002}$ |
| | ⋮ | ⋮ | ⋮ | ⋮ |
| | 252 | 0.9894 | $D_{252}$ | $t_{252}$ |
| | 253 | 0.9929 | $D_{253}$ | $t_{253}$ |
| | 254 | 0.9965 | $D_{254}$ | $t_{254}$ |
| WHITE | 255 | 1 | $D_{255}$ | $t_{255}$ |

FIG.8

| GRADATION | BIT VALUE | RELATIVE EMISSION LUMINANCE | RADIATION POWER [mW] | LD CURRENT [mA] | EXPOSURE TIME [ms] |
|---|---|---|---|---|---|
| BLACK | 0 | 0.1 | $P_{000}$ | $I_{000}$ | 1 |
| GRAY | 1 | 0.1035 | $P_{001}$ | $I_{001}$ | 1 |
| | 2 | 0.1071 | $P_{002}$ | $I_{002}$ | 1 |
| | ⋮ | ⋮ | ⋮ | ⋮ | ⋮ |
| | 252 | 0.9894 | $P_{252}$ | $I_{252}$ | 1 |
| | 253 | 0.9929 | $P_{253}$ | $I_{253}$ | 1 |
| | 254 | 0.9965 | $P_{254}$ | $I_{254}$ | 1 |
| WHITE | 255 | 1 | 0 | 0 | 1 |

FIG.9

| GRADATION | BIT VALUE | RELATIVE EMISSION LUMINANCE | TRANSMITTANCE OF A MASK [%] | EXPOSURE TIME [ms] |
|---|---|---|---|---|
| BLACK | 0 | 0.1 | $T_{000}$ | t |
| GRAY | 1 | 0.1035 | $T_{001}$ | t |
| | 2 | 0.1071 | $T_{002}$ | t |
| | ⋮ | ⋮ | ⋮ | ⋮ |
| | 252 | 0.9894 | $T_{252}$ | t |
| | 253 | 0.9929 | $T_{253}$ | t |
| | 254 | 0.9965 | $T_{254}$ | t |
| WHITE | 255 | 1 | $T_{255}$ | t |

METHOD FOR FORMING PATTERN OF ORGANIC ELECTROLUMINESCENT ELEMENT

TECHNICAL FIELD

One or more embodiments of the invention relate to a method of patterning an organic electroluminescent element. In particular, one or more embodiments of the invention relate to a method of pattering an organic electroluminescent element that can form a precise emission pattern having a predetermined gradation of emission luminance levels.

BACKGROUND ART

Organic luminescent elements have been drawing attention as thin luminescent materials.

Organic luminescent elements containing organic electroluminescent (EL) materials (hereinafter, also referred to as "organic EL elements") are thin perfect solid-state elements that can radiate light in response to a low voltage of several to several tens of volts and have many advantages such as high luminance, high luminescent efficiency, small thickness, and small weight. Such organic EL elements have drawn attention as backlights in various displays, display boards of notices and emergency lights, and surface-emitting luminescent bodies of light sources for lighting.

Such an organic EL element includes two electrodes and an organic functional layer that includes at least a light emitting layer and is disposed between the electrodes. The light generated at the light emitting layer passes through one of the electrodes and radiates to the exterior. Accordingly, at least one of the electrodes may be a transparent electrode that transmits light. Organic EL elements generally achieve high luminance from low electric power and have the advantages of superior visibility, a high response rate, a long lifetime, and low power consumption.

A proposed method of forming an emission pattern in such an organic EL element involves irradiating predetermined regions in an organic functional layer with adjusted doses of light so as to modify the functions of the predetermined regions in the organic functional layer, and forming an emission pattern having a gradation of emission luminance levels corresponding to the modified level of the function of the organic functional layer (for example, refer to PTL 1). In such a method, ultraviolet rays are radiated on the presumption that an increase in the cumulative dose, which is the product of ultraviolet intensity and exposure time, causes an increase in the modified level of the function of the organic functional layer.

The inventors discovered that, in formation of an emission pattern in an organic EL element through light irradiation, different relationships between light intensity [W/cm²] and exposure time [s] achieve different modified levels of the function of the organic functional layer, even if the organic EL element is irradiated with a constant cumulative dose [W·s/cm²] of the light.

Thus, irradiation of the organic EL element with focus on only cumulative dose may not yield an emission pattern having a predetermined gradation of emission luminance levels, depending on the relationship between light intensity and exposure time.

RELATED ART DOCUMENTS

Patent Documents

[PTL 1] Japanese Patent Application Laid-Open No. 2012-28335

SUMMARY OF THE INVENTION

One or more embodiments of the invention provide a method of forming a precise emission pattern having a predetermined gradation of emission luminance levels of an organic electroluminescent element.

The inventors have discovered that at least one of light intensity and exposure time may be controlled as a variable factor during light irradiation on the basis of reciprocity failure characteristics involving the modification of the function of an organic functional layer due to light irradiation, so as to form a precise emission pattern having a predetermined gradation of emission luminance levels.

One or more embodiments of the invention are exemplified below.

A method according to one or more embodiments includes forming an emission pattern on an organic electroluminescent element that includes an organic functional layer between two electrodes through light irradiation of the organic electroluminescent element. In the method, the emission pattern is formed under control of at least one of light intensity and exposure time as variable factors during the light irradiation. Further in the method, the at least one of light intensity and exposure time is controlled based on reciprocity failure characteristics involving modification of a function of the organic functional layer due to the light irradiation.

In one or more embodiments of the invention, at least one of light intensity and exposure time may be controlled based on the reciprocity failure characteristics determined through preliminary measurements of a mutual relationship between the level of the modification of the function of the organic functional layer due to the light irradiation and the at least one of the light intensity and the exposure time.

In one or more embodiments of the invention, the modification of the function of the organic functional layer due to the light irradiation may correspond to a variation in emission luminance of the organic electroluminescent element.

In one or more embodiments of the invention, the emission pattern may be formed with keeping the exposure time constant and with varying the light intensity.

In one or more embodiments of the invention, the emission pattern may be formed with keeping the light intensity constant and with varying the exposure time.

In one or more embodiments of the invention, the emission pattern may be formed through stippling by the light irradiation.

In one or more embodiments of the invention, the emission pattern may be formed by the light irradiation through a patterning mask to adjust the light intensity.

One or more embodiments of the invention may provide a method of forming a precise emission pattern having a predetermined gradation of emission luminance levels of an organic electroluminescent element.

The mechanisms and operation that establish the advantages of one or more embodiments of the invention are described below.

The method of patterning an organic electroluminescent element according to one or more embodiments of the invention forms an emission pattern under control of at least one of the light intensity and exposure time as variable factors during light irradiation on the basis of reciprocity failure characteristics involving the modification of the function of an organic functional layer due to light irradiation. Accordingly, the light intensity and the exposure time may be appropriately determined in accordance with a predetermined emission luminance level, so as to form a precise emission pattern having a predetermined gradation of emission luminance levels.

According to one or more embodiments of the invention, light intensity and exposure time may be appropriately determined to achieve a predetermined emission luminance level. Accordingly, an organic electroluminescent element may be irradiated with light having a minimum cumulative dose, so as to efficiently pattern the organic electroluminescent element.

BRIEF DESCRIPTION OF DRAWINGS

FIG. 2 is a graph illustrating the relationship between cumulative dose and relative emission luminance of an organic EL element irradiated with light having a wavelength of 365 nm at different intensities.

FIG. 3 is a graph illustrating the relationship between cumulative dose and relative emission luminance of an organic EL element irradiated with light having a wavelength of 385 nm at different intensities.

FIG. 8 illustrates the radiation power P of an LD light source and the LD current I corresponding to different relative emission luminance levels.

FIG. 9 illustrates the light transmittance T corresponding to different relative emission luminance levels.

DETAILED DESCRIPTION OF EMBODIMENTS

Figure 1:
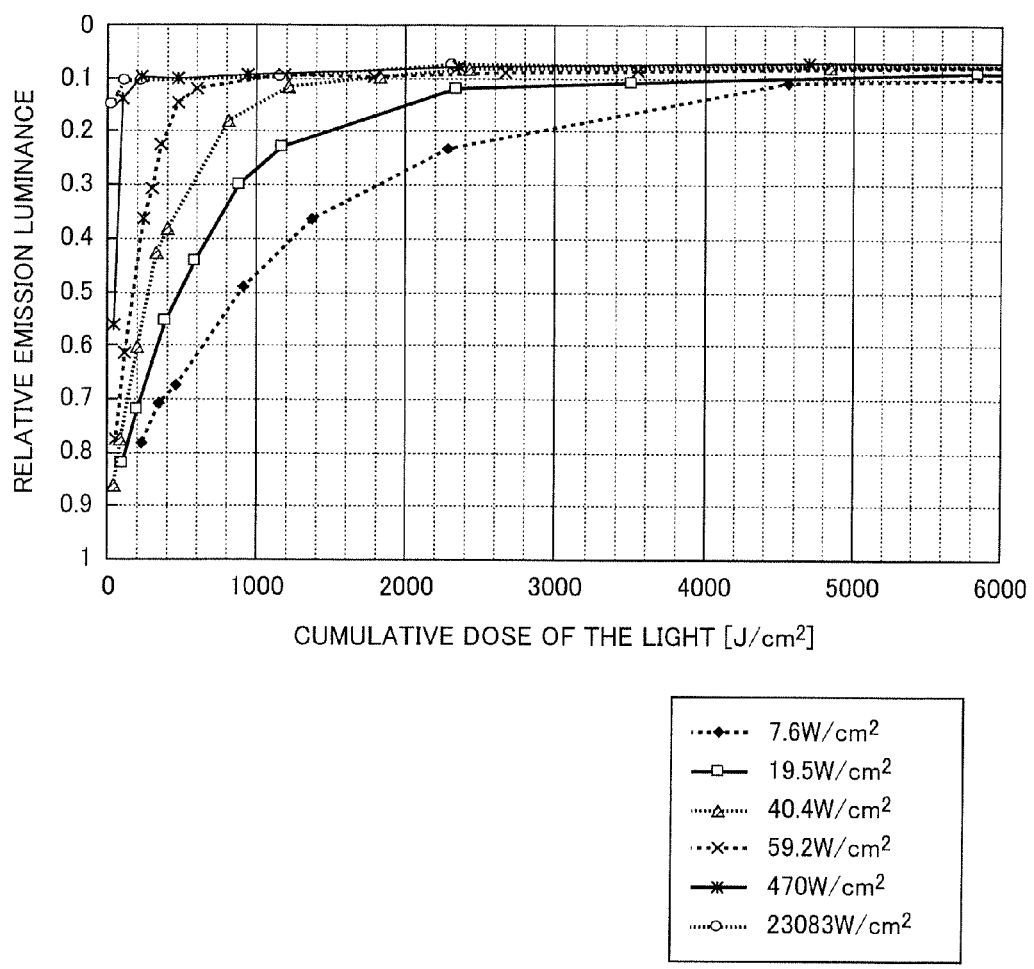
FIG. 1 is a graph illustrating the relationship between cumulative dose and relative emission luminance of an organic EL element irradiated with light having a wavelength of 404 nm at different intensities.

In the method according to one or more embodiments of the invention, an emission pattern is formed under control of at least one of the light intensity and exposure time as variable factors during light irradiation on the basis of reciprocity failure characteristics involving the modification of the function of an organic functional layer due to light irradiation.

According to one or more embodiments of the invention, an emission pattern may be formed under control of at least one of the light intensity and exposure time on the basis of reciprocity failure characteristics determined through preliminary measurements of the mutual relationship between the modified level of the function of the organic functional layer due to light irradiation and the at least one of light intensity and exposure time. Through such a process, the light intensity and exposure time can be appropriately determined in accordance with predetermined emission luminance levels so as to form a precise emission pattern having a predetermined gradation of emission luminance levels.

According to one or more embodiments of the invention, the emission pattern may be formed with keeping the exposure time constant and with varying the light intensity. This allows the use of a known exposure-region scanning technique for the formation of an emission pattern through laser irradiation, for example, and can facilitate the patterning of organic EL elements and reduce the patterning costs.

According to one or more embodiments of the invention, the emission pattern may be formed with keeping the light intensity constant and with varying the exposure time. In this way, the light intensity does not need to be varied, and thus, light detectors and amplifiers having a wide dynamic range and a high S/N ratio are not required for monitoring of the light intensity. Thus, the patterning of an organic EL element is facilitated, and the cost of patterning can be reduced.

According to one or more embodiments of the invention, the emission pattern may be formed by stippling through light irradiation. This can form a precise emission pattern in an organic electroluminescent element.

According to one or more embodiments of the invention, the emission pattern may be formed through a pattern forming mask to adjust the intensity of the radiated light. This can facilitate the formation of an emission pattern in an organic electroluminescent element.

Components and embodiments of one or more embodiments of the invention will now be described in detail. Throughout the specification, the term "to" indicating the numerical range is meant to be inclusive of the boundary values.

<<Configuration of Organic Electroluminescent Element>>

The configuration of an organic electroluminescent element (hereinafter also referred to as "organic EL element") according to one or more embodiments of the invention will now be described.

An organic EL element includes a substrate, a first electrode, an organic functional layer, and a second electrode, disposed in sequence. An extraction electrode may be disposed at the end region of the first electrode such that an external power supply (not shown) is connected to the first electrode via the extraction electrode. Light is radiated from the organic EL element through the substrate or the surface remote from the substrate.

The organic EL element may have any layer configuration, such as a typically known layer configuration. For example, the first electrode functions as the anode, and the second electrode as the cathode. In such a case, the organic functional layer, for example, includes the following layers in sequence from the side adjacent to the first electrode or anode: hole injecting layer/hole transport layer/light emitting layer/electron transport layer/electron ejecting layer. The organic functional layer may include a light emitting layer composed of an organic material. The hole injecting layer and the hole transport layer may be replaced with a single hole transport/injecting layer, whereas the electron transport layer and the electron injecting layer may be replaced with a single electron transport/injecting layer. In some cases, a layer of the organic functional layer may be composed of an inorganic material, such as the electron injecting layer.

The organic functional layer may further include a hole blocking layer and/or an electron blocking layer disposed at appropriate positions, if necessary. The light emitting layer includes color light emitting layers that radiate light in different wavelength ranges. Such color light emitting layers may be provided with non-light-emitting intermediate layers disposed therebetween. The intermediate layer may function as a hole blocking layer or an electron blocking layer.

The second electrode or cathode may have any appropriate layer configuration. An auxiliary electrode may be provided in contact with the first electrode so as to reduce the resistance of the first electrode.

In such a configuration, only a certain portion of the organic functional layer disposed between the first electrode and the second electrode (the area in which the first electrode, the organic functional layer, and the second electrode are overlaid along the arrayed direction) serves as a light emitting region of the organic EL element.

An organic EL element having such a configuration is sealed to the substrate with a sealant described below in order to prevent degradation in the organic functional layer composed of an organic material and other materials. The terminals of the first electrode, the second electrode, and the extraction electrode are exposed from the sealant, being insulated from each other on the substrate.

An emission pattern having a predetermined gradation of emission luminance levels can be formed in an organic EL element having the configuration described above through the following method of patterning.

<<Method of Patterning Organic EL Element>>
(1) Reciprocity Failure Characteristics The inventors discovered that, during patterning of an organic EL element through light irradiation, reciprocity failure is observed in the relationship between the modification level of the function of an organic functional layer and the cumulative dose of light radiated on to the organic EL element, as illustrated in FIG. 1. The modification of the function of the organic functional layer caused by light irradiation results in a variation in emission luminance of the organic EL element corresponding to the level of modification.

The term "reciprocity" in one or more embodiments of the invention refers to the conformity to the Bunsen-Roscoe law stating that if the cumulative dose, which is the product of the intensity of the radiated light and the exposure time, is constant, the modification level of the organic functional layer is also constant. The term "reciprocity failure" in one or more embodiments of the invention refers to the nonconformity to the reciprocity law stating that if the cumulative dose, which is the product of the intensity of the radiated light and the exposure time, is constant, the modification level of the organic functional layer is also constant. The term "reciprocity failure characteristics" refers to a relationship among the light intensity, the exposure time, and the modification level of the organic functional layer, particularly a relationship that causes reciprocity failure for a predetermined light intensity or exposure time. The organic functional layer may include partial regions in which the reciprocity law holds.

FIG. 1 is a graph illustrating the measurements of relative emission luminance levels of an organic EL element corresponding to cumulative doses of light having different intensities radiated from a light source composed of a semiconductor laser having a wavelength of 404 nm. The relative emission luminance of the organic EL element according to one or more embodiments of the invention is a relative value to a reference luminance "1" of an organic functional layer that is not exposed to light and thus unmodified (equivalent to white luminance). An organic functional layer modified through light irradiation has a lowest emission luminance equivalent to black luminance, which is approximately 0.1 according to this measurement. Light is radiated onto the transparent substrate after the organic EL element is sealed. FIG. 1 illustrates the measurements of relative emission luminance levels of the organic EL element corresponding to the cumulative doses of light having the following intensities (W/cm$^2$) radiated onto the organic EL element: 7.6, 19.5, 40.4, 59.2, 470.0, and 23083.0 W/cm$^2$.

With reference to FIG. 1, the relative emission luminance of the organic EL element varies depending on the light intensity, even if a constant cumulative dose of light is radiated onto the organic EL element. This indicates that reciprocity failure occurs during patterning of the organic EL element through light irradiation because the relative emission luminance of the organic functional layer varies depending on light intensity and exposure time, even if the cumulative dose is constant.

The measurements in FIG. 1 indicate that a pattern having a predetermined relative emission luminance can be acquired at a smaller cumulative dose under a higher light intensity.

As illustrated in FIGS. 2 and 3, the same characteristics hold for the use of light sources or light emitting diodes (LEDs) having wavelengths of 365 and 385 nm. FIG. 2 illustrates the relative emission luminance levels of an organic EL element corresponding to the cumulative doses of light having different intensities radiated from an LED having a wavelength of 365 nm, and FIG. 3 illustrates that radiated from an LED having a wavelength of 385 nm.

(2) Method of Patterning Based on Reciprocity Failure Characteristics

Based on the findings described above, the method of patterning an organic EL element according to one or more embodiments of the invention includes forming an emission pattern under control of at least one of the light intensity and exposure time as variable factors during light irradiation on the basis of reciprocity failure characteristics involving the modification of the function of an organic functional layer due to light irradiation. An example method will now be described in detail.

Figure 4:
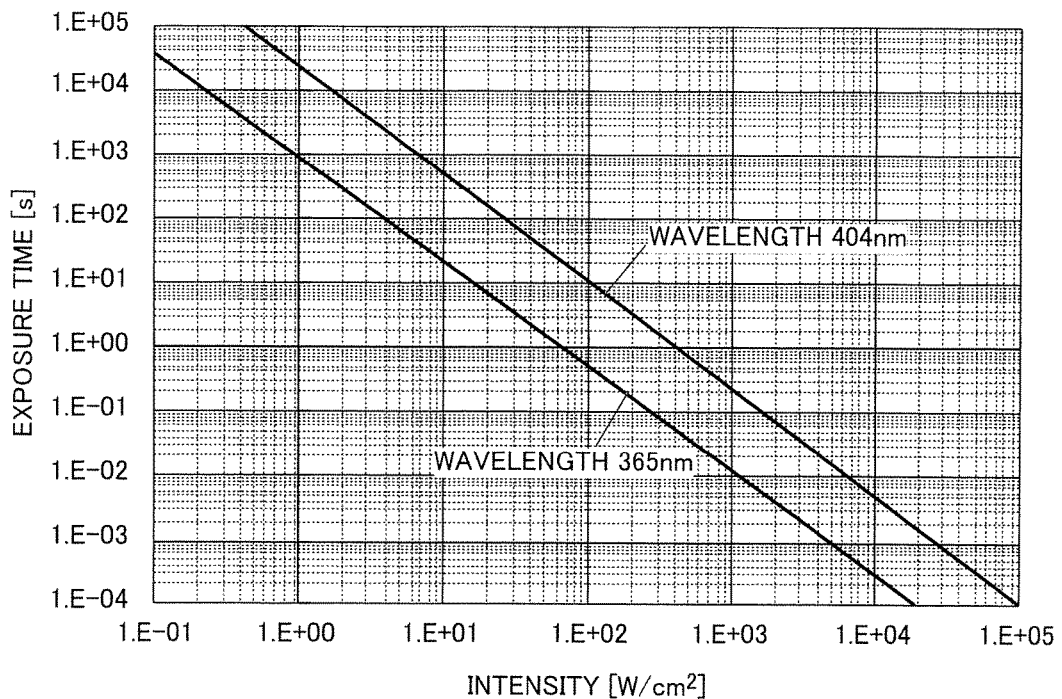
FIG. 4 is a graph illustrating the relationship between light intensity and exposure time required for the formation of a pattern for a relative emission luminance of 0.1.

The relationship is determined between light intensity and exposure time that is required for the formation of patterns corresponding to different relative emission luminance levels of the organic EL element modified through light irradiation. For example, FIG. 4 is a logarithmic graph illustrating the relationship between the light intensity and exposure time required for the formation of a pattern corresponding to a relative emission luminance of 0.1. FIG. 4 illustrates the relationships determined with light sources having wavelengths of 365 and 404 nm for irradiation of the sealed organic EL element on a side adjacent to the transparent substrate.

For a pattern corresponding to a relative emission luminance of 0.1, as illustrated in FIG. 4, the exposure time Y with a light source having a wavelength of 404 nm is represented by $Y=2.47\times10^4 X^{-1.67}$ where X is light intensity X. For a light source having a wavelength of 365 nm, the exposure time Y is represented by $Y=9.15\times10^2 X^{-1.61}$. The light source having a wavelength of 365 nm can form a pattern corresponding to a relative emission luminance of 0.1 at a lower light intensity and a smaller exposure time, compared to the light source having a wavelength of 404 nm.

Figure 5:
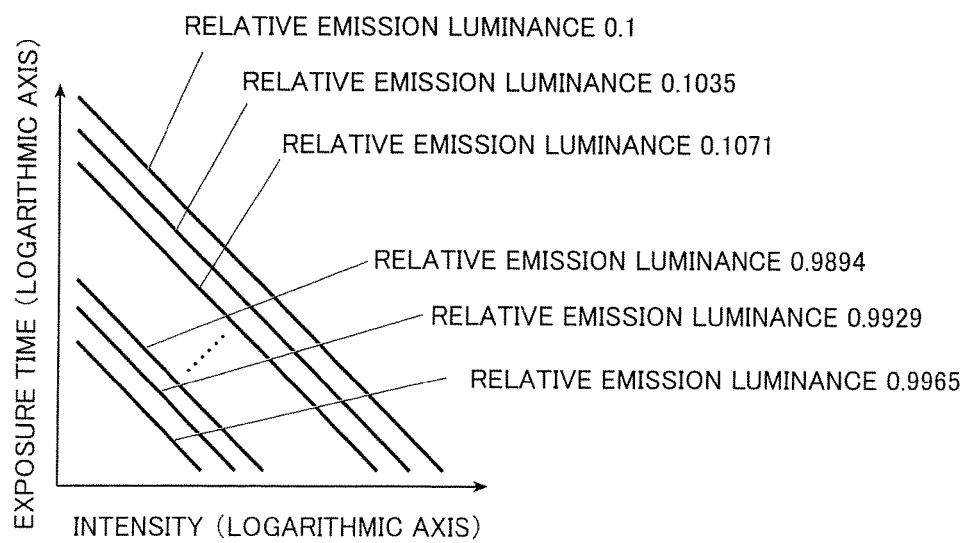
FIG. 5 is a graph illustrating the relationship between light intensity and exposure time required for the formation of patterns for different relative emission luminance levels.

The emission patterns formed through light irradiation can be represented by an 8-bit 256 gradation by equally dividing the relative emission luminance of 1 to 0.1 into 256 levels, measuring the light intensity and exposure time required for the formation of patterns corresponding to the equally divided relative emission luminance levels, and determining the relationship between the light intensity and exposure time, as illustrated in FIG. 5. FIG. 5 illustrates the relationship between light intensity and exposure time required for the formation of patterns corresponding to different relative emission luminance levels.

Figures 6, 7:
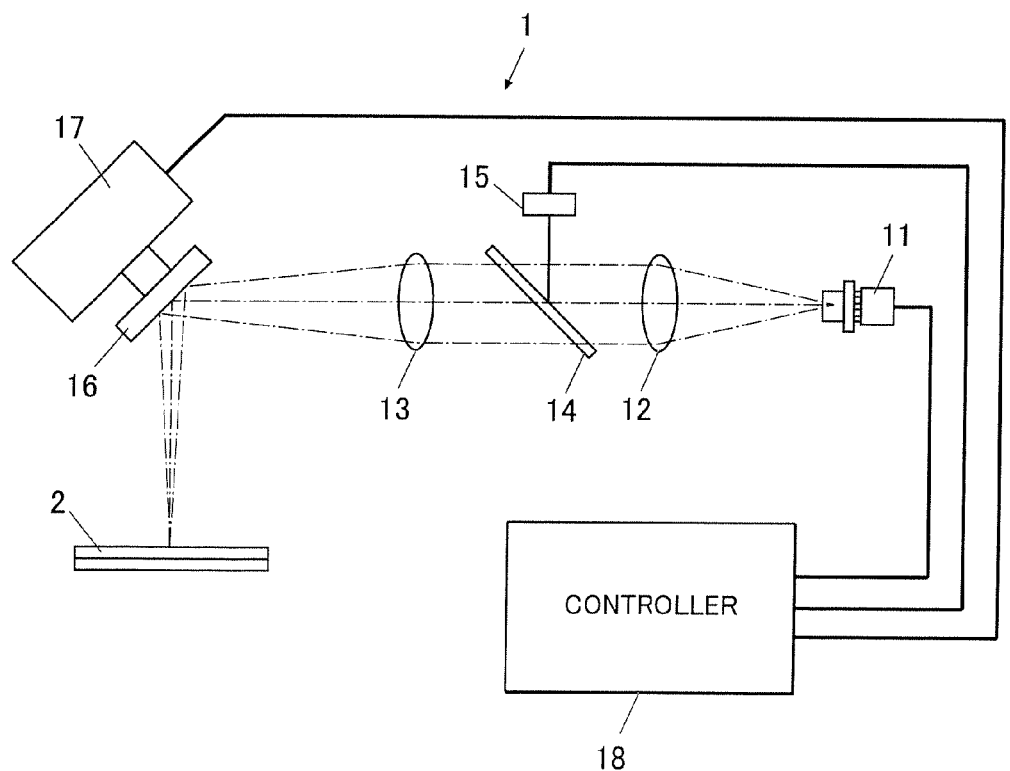
FIG. 6 illustrates the light intensity D and the exposure time t corresponding to different relative emission luminance levels.
FIG. 7 is a schematic view illustrating an emission pattern forming device.

With reference to FIG. 6, the light intensity and the exposure time are determined for each relative emission luminance level. FIG. 6 illustrates the light intensity D and the exposure time t for each relative emission luminance level.

For example, a pattern corresponding to a relative emission luminance of 0.1 can be formed through irradiation of light having an intensity $D_{000}$ and an exposure time $t_{000}$. The light intensity $D_{000}$ and the exposure time $t_{000}$ can be any value on the curve representing the relative emission luminance of 0.1 in FIG. 5 (which is a substantial straight line in a logarithmic graph). Similarly, patterns corresponding to other relative emission luminance levels can be formed through irradiation of light having an intensity D and an exposure time t, as illustrated in FIG. 6. The light intensity D and the exposure time t can be any value on the curves corresponding to the relative emission luminance in FIG. 5.

The light intensity D and the exposure time t for the pattern corresponding to a particular relative emission luminance may be appropriately selected depending on the configuration of the light irradiator or the process of light irradiation. For example, as described below, the patterns can be formed through stippling by light scanning at a constant rate on predetermined areas of a light emitting surface of the organic EL element. In such a case, the different relative emission luminance levels are established through an identical exposure time and variable light intensity selected from the graph in FIG. 5 illustrating the different emission luminance levels.

The light intensity $D_{255}$ and the exposure time $t_{255}$ may be zero to establish a contrast between the patterns corresponding to relative emission luminance levels of 1 and 0.1.

Different areas on the light emitting surface of the organic EL element are irradiated with light having light intensities and exposure times corresponding to the different emission luminance levels so as to form a predetermined pattern on the light emitting surface of the organic EL element.

The organic EL element may be irradiated with light after the organic EL element is sealed with a sealant or immediately after any of the layers of the organic functional layer are disposed.

The organic EL element may be irradiated from any direction from which light reaches the organic functional layer and modifies the function of the organic functional layer. For example, light may be radiated onto the side adjacent to or remote from the substrate. The substrate and electrodes disposed on the light-incident side of the organic EL element may be composed of a transmissive material.

(3) Method of Patterning Through Stippling and Pattern Forming Device

A pattern forming device 1 suitably used in the method of patterning an organic EL element according to one or more embodiments of the invention will now be described with reference to FIG. 7.

FIG. 7 is a schematic view illustrating a pattern forming device 1 that can carry out the patterning process according to one or more embodiments of the invention. The pattern forming device 1 is a stippler that forms an emission pattern consisting of minute dots on an organic EL element 2.

The pattern forming device 1 includes a semiconductor (laser diode (LD)) light source 11 that emits laser beams of a particular wavelength, a collimator lens 12 that collimates light from the LD light source 11, a condenser lens 13 that condenses the light collimated by the collimator lens 12 to a spot having a predetermined diameter, a beam splitter 14 that partially reflects the light from the collimator lens 12, a light detector 15 that detects the intensity of the light reflected at the beam splitter 14, a reflecting mirror 16 that reflects the light from the condenser lens 13 toward the organic EL element 2, an adjuster 17 that adjusts the tilt of the reflecting mirror 16, and a controller 18 that controls the components of the forming device.

The controller 18 of the pattern forming device 1 generates emission luminance data representing the emission luminance level of every coordinate in an image corresponding to the image data sent from an external device (not shown) (e.g., PCs, various types of servers, and printers).

The controller 18 calculates the light intensity and/or exposure time required for the formation of a dot having a predetermined relative emission luminance.

The pattern forming device 1 forms dots having predetermined emission luminance levels through light irradiation with a variable light intensity during a certain exposure time. In this way, a known scanning technique can be used. Thus, an emission pattern can be readily formed with the pattern forming device 1, and the production cost of the pattern forming device 1 can be reduced.

The controller 18 sets the exposure time for every relative emission luminance level to, for example, 1 ms and calculates the light intensities required for the formation of dots having different relative emission luminance levels. The controller 18 calculates the emission power P [mW] of the light radiated from the LD light source 11 and the current (LD current) I [mA] to be applied to the LD light source 11 to radiate light having the emission power P on the basis of the light intensity corresponding to a predetermined relative emission luminance (see FIG. 8). In FIG. 8, an LD current I of zero is required for the formation of a dot having a relative emission luminance level of 1. Alternatively, the LD current I may be any value other than zero below the threshold of the LD light source 11.

The controller 18 adjusts the tilt of the reflecting mirror 16 around two axes by the adjuster 17 every 1 ms, scans predetermined areas on the organic EL element in the X and Y directions, and outputs pulsed signals indicating the LD current values for every coordinate based on the emission luminance data to the LD light source 11. The LD light source 11 radiates laser beams in accordance with the input pulsed signals so as to form a predetermined pattern through the formation of dots on the organic EL element. Before light radiation, the controller 18 instructs the light detector 15 to detect the intensity of the light reflected at the beam splitter 14 and monitors the data on the detected light. In this way, if the intensity of the light radiated from the LD light source 11 includes an error due to variation in temperature and/or humidity in the atmosphere, the controller 18 can adjust the LD current I to be applied to the LD light source 11 so as to emit light of a correct intensity.

The pattern forming device 1 has an exposure time of 1 ms. Alternatively, the exposure time may be any value.

The pattern forming device 1 forms dots having predetermined emission luminance levels by light having a variable light intensity during a certain exposure time. Alternatively, the dots may be formed by light having a constant intensity during a variable exposure time. Such a case does not require detection of the light intensity over a wide range, and thus, the light detector 15 and an amplifier (not shown) that convers the output of the light detector 15 from current I to voltage V and amplifies the result do not require components that have a wide dynamic range and a high S/N ratio. Thus, the cost of the pattern forming device 1 can be reduced.

The pattern forming device 1 forms dots having predetermined emission luminance levels by light irradiation under constant exposure time and variable light intensity. Alternatively, the light intensity and the exposure time may both be variable.

(4) Method of Patterning with Mask

The method of patterning the organic EL element according to one or more embodiments of the invention is not limited to patterning through stippling. Alternatively, patterning with a patterning mask may be performed.

In the method of patterning with a mask, the intensity and exposure time of the light radiated from a light source are constant, and the light is transmitted through a mask including regions having different transmittance levels corresponding to a predetermined emission pattern to be formed on the organic EL element. That is, the regions having different transmittance levels of the mask control the intensity of the light incident on the organic EL element so as to form a predetermined pattern.

The transmittance of the regions in the mask is established as illustrated in FIG. 9. The transmittance illustrated in FIG. 9 is determined from the relationship between the light intensity and exposure time corresponding to each relative emission luminance illustrated in FIG. 5.

That is, in patterning with a mask, the exposure time of light is set to a predetermined value, and the intensity of light required for the formation of patterns corresponding to different relative emission luminance levels is determined from the graph in FIG. 5. The transmittance T of a mask to be used for the formation a pattern corresponding to a particular relative emission luminance is represented by $T=D/D_{msk}$, where D is the intensity of light incident on the organic EL element to form the pattern corresponding to the particular relative emission luminance, and $D_{msk}$ is the intensity of light incident on the mask. The intensity $D_{msk}$ of the light incident on the mask may be larger than the intensities $D_{000}$ to $D_{255}$ of the light required for the formation of the patterns corresponding to the different relative emission luminance levels or the maximum value among the relative emission luminance levels $D_{000}$ to $D_{255}$.

The transmittance of the mask required for the formation of a pattern corresponding to a relative emission luminance of 1 may be 0%, so as to facilitate mask production.

A predetermined emission pattern can be formed on an organic EL element by disposing a mask having the configuration described above on the light emitting surface of the organic EL element and irradiating the organic EL element via the mask with light having a predetermined light intensity and for a predetermined exposure time.

(5) Light Intensity and Exposure Time

The light intensity and exposure time in the method of patterning will now be described through examples.

With reference to FIG. 1, a pattern having a predetermined relative emission luminance can be acquired through a smaller cumulative dose at a higher light intensity. Thus, a higher light intensity can significantly reduce the exposure time.

For example, in stippling through irradiation with light from a light source having an emission wavelength of 404 nm, a light intensity of 26 kW/cm$^2$ or higher can form a dot having a relative emission luminance of 0.1 in an exposure time of 1 ms or less, as illustrated in FIG. 4. Thus, an emission pattern can be formed at a significantly high rate. If the resolution is 200 dpi, the size of a dot is 25.4 mm/200=0.127 mm. Thus, if half of the 100×100 mm effective emission area of the organic EL element is a non-light-emitting region (having a relative emission luminance of 0.1), the number of dots to be formed is (stippling area 100×100 mm×0.5)/(dot size 0.127×0.127 mm)=310000 dots, and the stippling time is 310000×1 ms=310 s=5.2 min, which is approximately five minutes, i.e., a significantly short time period.

A shorter wavelength of the radiated light can leads to a shorter time required for patterning.

For example, if a light source having a wavelength of 365 nm is used, a dot having a relative emission luminance of 0.1 can be formed during an exposure time of 1 ms at a light intensity of 4.8 kW/cm$^2$, as illustrated in FIG. 4.

The light intensity D corresponding to a wavelength λ and an exposure time of 1 ms is represented by D [W/cm$^2$]=550 [nm]−1.96×10$^5$. Thus, in the patterning through stippling, the light intensity can be set to 550λ [nm]−1.96×10$^5$ or higher to perform patterning at a significantly high rate. FIG. 4 illustrates the result of light irradiation of an organic EL element including a laminate of a substrate and a first electrode having a transmittance of 70%, and thus, the intensity of the light radiated onto the light emitting layer may be 385λ [nm]−1.37×10$^5$ or higher.

If patterning with a mask is performed with a typical commercially available UV exposure device, the light intensity of the device is between several tens of to several hundreds of mW/cm$^2$. Thus, the exposure time may be 10 hours or more, reducing productivity. As described above, a higher intensity of light radiated for the patterning of the organic EL element can significantly reduce exposure time. The light intensity can be increased to 0.43 W/cm$^2$ or higher through the installation of multiple lamps as light sources having a wavelength of 365 nm so as to reduce the exposure time to one hour or less. This significantly increases throughput.

Similar to patterning by stippling, the light intensity D corresponding to a wavelength λ and an exposure time of 1 hour is represented by expression D [W/cm$^2$]=0.070λ [nm]−25. Thus, in patterning with a mask, the light intensity may be set to 0.070λ [nm]−25 or higher to achieve high productivity even in patterning by light having a wavelength outside the ultraviolet range. The intensity of the light radiated onto the light emitting layer may be 0.049λ [nm]−17.5 or higher.

Layers used in an organic EL element applicable to the method of patterning according to one or more embodiments of the invention and the production process of the layers will now be described in detail.

<<Substrate>>

Any substrate may be used in the organic EL element according to one or more embodiments of the invention, e.g., a transparent or opaque glass or plastic substrate. The transparent substrate may be composed of glass, quartz, or a transparent resin film. The substrate may be composed of a resin film that provides flexibility to the organic EL element.

A substrate having any thickness may be selected.

Examples of the resin film include polyesters, such as poly(ethylene terephthalate) (PET) and poly(ethylene naphthalate) (PEN); polyethylene; polypropylene; cellulose esters and derivatives thereof, such as cellophane, cellulose diacetate, cellulose triacetate (TAC), cellulose acetate butylate, cellulose acetate propionate (CAP), cellulose acetate phthalate, and cellulose nitrate; poly(vinylidene chloride); poly(vinylalcohol);poly(ethylene-vinylalcohol); syndiotactic polystyrene; polycarbonates; norbornene; polymethylpentene; polyether ketones; polyimides; polyethersulfones (PESs); poly(phenylene sulfide): polysulfones; polyetherimides; polyether ether ketone imides; polyamide; fluororesin; nylon; polymethyl methacrylate; acrylic and polyarylate polymers; and cycloolefin polymers, such as Arton (product of JSR Corporation) and Apel (product of Mitsui Chemicals Inc.).

An inorganic and/or organic gas barrier film is disposed on the surface of a resin film. Such a gas barrier film may have a water vapor permeability of 0.01 g/m$^2$·24 h or less (at a temperature of 25±0.5° C. and a relative humidity of 90±2% RH) measured through a procedure in accordance with JIS K 7129-1992, may have an oxygen permeability of 10$^{-3}$ ml/m$^2$·24 h~atm or less measured through a procedure in accordance with JIS K 7126-1987 and a water vapor permeability of 10$^{-5}$ g/m$^2$~24 h or less.

The gas barrier film may be composed of a material such as silicon oxide, silicon dioxide, and silicon nitride, which can prevent the intrusion of substances, such as water or oxygen, that cause degradation. The fragility of the gas barrier film can be reduced through a layer configuration of layers composed of inorganic and organic materials. The layer configuration may include inorganic and organic layers in any sequence. A layer configuration may include alternating inorganic and organic layers.

The gas barrier film may be formed through any procedure. Examples of such a procedure include vacuum vapor deposition, sputtering, reactive sputtering, molecular beam epitaxy, cluster ion beam method, ion plating, plasma polymerization, atmospheric-pressure plasma polymerization, plasma CVD, laser CVD, thermal CVD, and coating. An example procedure is atmospheric-pressure plasma polymerization described in Japanese Patent Application Laid-Open No. 2004-68143.

Examples of an opaque support substrate includes metal plates composed of aluminum or stainless steel, an opaque resin substrate, and a ceramic substrate.

<<First Electrode>>

The first electrode may be any electrode that can typically be used for an organic EL element. Specifically, the electrode may be composed of aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors, such as ITO, ZnO, TiO$_2$, and SnO$_2$.

According to one or more embodiments of the invention, the first electrode may be a transparent electrode, and may be a transparent metal electrode. The transparency of the first electrode refers to a transmittance of 50% or more to light having a wavelength of 550 nm.

The first electrode may be formed through any appropriate procedure including known spin coating, vapor deposition, or sputtering. The first electrode may be patterned through an appropriately selected procedure including known photolithography and patterning with a mask. The first electrode may have a transmittance of 10% or higher so as to radiate light to the exterior, and may have a sheet resistance of several hundreds of Q/square or less.

The first electrode may have a thickness typically within the range of 10 to 1000 nm, or 10 to 200 nm, depending on the material.

The first electrode may have a double layer configuration consisting of a primary layer disposed on the substrate, and an electrode layer disposed thereon. The electrode layer is composed of silver or an alloy having a main constituent of silver, for example, and the primary layer is composed of a compound containing nitrogen atoms, for example. The term "main constituent" in the electrode layer refers to a substance that is contained in the electrode layer at a level of 98 mass % or more.

<<Organic Functional Layer (Light Emitting Functional Layer)>>

(1) Light Emitting Layer

The organic functional layer at least includes a light emitting layer.

The light emitting layer according to one or more embodiments of the invention contains an electro-phosphorescent compound as a light emitting material. The light emitting material layer may contain different electro-phosphorescent compounds. The light emitting material may include a fluorescent material or may include both an electro-phosphorescent compound and a fluorescent material.

In the light emitting material layer, electrons injected from the second electrode or the electron transport layer recombine with the positive holes injected from the first electrode or the hole transport layer and generate light. The light emitting region of the light emitting layer may be inside the light emitting layer or at the boundary between the light emitting layer and the adjacent layer.

The light emitting layer may have any composition containing a light emitting material that satisfies the emission requirements. Two or more light emitting layers may be provided that have the same emission spectrum and the same maximum emission wavelength. In such a case, a non-light-emitting intermediate layer (not shown) may be disposed between the two adjacent light emitting layers.

The total thickness of the light emitting layers may be within the range of 1 to 100 nm, or 1 to 30 nm for the establishment of a lower driving voltage.

The total thickness of the light emitting layers includes the thickness of the non-light-emitting intermediate layers disposed between the light emitting layers.

If multiple light emitting layers are provided, each light emitting layer may have a thickness within the range of 1 to 50 nm, or 1 to 20 nm. If the multiple light emitting layers respectively radiate blue, green, and red light, any relationship of the thickness may be established among the different light emitting layers.

Such a light emitting layer may be formed through any known procedure for thin-film formation through deposition of known light emitting materials or host compounds through, for example, vacuum vapor deposition, spin coating, casting, LB method, or inkjet printing.

The known phosphorescent compounds applicable to one or more embodiments of the invention are those described in the following documents:

Nature 395, 151 (1998), Appl.Phys.Lett. 78, 1622 (2001), Adv.Mater. 19, 739 (2007), Chem.Mater. 17, 3532 (2005), Adv.Mater. 17, 1059 (2005), WO2009/100991, WO2008/101842, WO2003/040257, U.S. Patent application publication Nos. 2006/835469, 2006/0202194, 2007/0087321, 2005/0244673, Inorg.Chem. 40, 1704 (2001), Chem.Mater. 16, 2480 (2004), Adv.Mater. 16, 2003 (2004), Angew.Chem.Int.Ed. 2006, 45, 7800, Appl.Phys.Lett. 86, 153505 (2005), Chem.Lett. 34, 592 (2005), Chem.Commun. 2906 (2005), Inorg.Chem. 42, 1248 (2003), WO2009/050290, WO2009/000673, U.S. Pat. No. 7,332,232, U.S. Patent application publication No. 2009/0039776, U.S. Pat. No. 6,687,266, U.S. Patent application publication Nos. 2006/0008670 and 2008/0015355, U.S. Pat. No. 7,396,598, U.S. Patent application publication No. 2003/0138657, U.S. Pat. No. 7,090,928, Angew.Chem.Int.Ed. 47, 1 (2008), Chem.Mater. 18, 5119 (2006), Inorg.Chem. 46, 4308 (2007), Organometallics 23, 3745 (2004), Appl.Phys.Lett. 74, 1361 (1999), WO2006/056418, WO2005/123873, WO2005/123873, WO2006/082742, U.S. Patent application publication No. 2005/0260441, U.S. Pat. No. 7,534,505, U.S. Patent application publication No. 2007/0190359, U.S. Pat. Nos. 7,338,722 and 7,279,704, U.S. Patent application publication No. 2006/103874, WO2005/076380, WO2008/140115, WO2011/134013, WO2010/086089, WO2012/020327, WO2011/051404, WO2011/073149, Japanese Unexamined Patent Application Publication Nos. 2009-114086, 2003-81988, and 2002-363552.

In one or more embodiments of the invention, the phosphorescent compound may be an organic metal complex containing an Ir central metal, or a complex having at least one coordinate bond selected from the group consisting of a metal-carbon bond, a metal-nitrogen bond, a metal-oxygen bond, and a metal-sulfur bond.

The above-described phosphorescent compound (also referred to as phosphorescent metal complex) can be prepared in any of the synthetic processes disclosed in the following documents: Organic Letter, vol. 3, No. 16, pp. 2579-2581 (2001), Inorganic Chemistry, vol. 30, No. 8, pp. 1685-1687 (1991), J.Am.Chem.Soc., vol. 123, p. 4304 (2001), Inorganic Chemistry, vol. 40, No. 7, pp. 1704-1711 (2001), Inorganic Chemistry, vol. 41, No. 12, pp. 3055-3066 (2002), New Journal of Chemistry., vol. 26, p. 1171 (2002), and European Journal of Organic Chemistry, vol. 4, pp. 695-709 (2004); and the documents cited in these documents.

As specific examples of a host compounds, the compounds described in the following Documents are cited. However, the invention is not limited to them.

Japanese patent application publication (JP-A) Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837; US Patent Application Publication (US) Nos. 2003/0175553, 2006/0280965, 2005/0112407, 2009/0017330, 2009/0030202, 2005/0238919; WO 2001/039234, WO2009/021126, WO 2008/056746, WO 2004/093 207, WO 2005/089025, WO 2007/063796, WO 2007/063754, WO 2004/107822, WO 2005/030900, WO 2006/114966, WO 2009/086028, WO 2009/003898, WO 2012/023947, JP-A 2008-074939, JP-A 2007-254297 and EP 2034538.

(2) Injecting Layer (Hole Injecting Layer, Electron Injecting Layer)

Injecting layers, which are categorized into a hole injecting layer and an electron injecting layer, are disposed between an electrode and a light emitting layer to lower the driving voltage and enhance the emission luminance. Details of the injecting layers are described in Chapter 2 "*Denkyoku zairyou* (Electrode Materials)" in the second version of "*Yuuki EL soshi to sono kougyouka saizensen* (Organic EL Devices and the Forefront of Their Industrialization)" (Nov. 30, 1998, NTS Inc., pp. 123-166).

An injecting layer may be provided if required. A hole injecting layer may be disposed between the anode and a light emitting layer or a hole transport layer, and an electron injecting layer may be disposed between the cathode and alight emitting layer or an electron transport layer.

Details of the hole injecting layers are described in Japanese Patent Application Laid-Open Nos. 9-45479, 9-260062, and 8-288069. Examples of the hole injecting layer include layers of phthalocyanine represented by copper phthalocyanine, layers of oxides represented by vanadium oxide, amorphous carbon layers, and polymer layers containing conductive polymers, such as polyaniline (emeraldine) and polythiophene.

Details of the electron injecting layers are described in Japanese Patent Application Laid-Open Nos. 6-325871, 9-17574, and 10-74586. Examples of the electrode injecting layer include layers of metals represented by strontium and aluminum, layers of alkali metal halides represented by potassium fluoride, layers of alkaline-earth metal compounds represented by magnesium fluoride, and oxide layers represented by molybdenum oxide. The electron injecting layer according to one or more embodiments of the invention may have a very small thickness in the range of 1 nm to 10 μm, depending on the material.

(3) Hole Transport Layer

The hole transport layer is composed of a hole transport material that can transport positive holes. The hole injecting layers and electron blocking layers are also categorized into hole transport layers in a broad sense. The hole transport layer may have a monolayer or multilayer configuration.

The hole transport material may be any organic or inorganic material that can inject or transport positive holes or block electrons. Examples of the hole transport material include derivatives of triazole, oxadiazole, imidazole, polyarylalkane, pyrazoline, pyrazolone, phenylenediamine, arylamine, amino-substituted chalcone, oxazole, styrylanthracene, fluorenone, hydrazone, stilbene, and silazane, aniline copolymers, and conductive polymeric oligomers, particularly thiophene oligomers.

Although any of the above materials may be used as the hole transport material, the compounds may be porphyrin compounds, aromatic tertiary amine compounds, and styrylamine compounds.

Representative examples of the aromatic tertiary amine compounds and styrylamine compounds include
N,N,N',N'-tetraphenyl-4,4'-diaminophenyl;
N,N'-diphenyl-N,N'-bis(3-methylphenyl)-[1,1'-biphenyl]-4,4'-diamine (TPD); 2,2-bis(4-di-p-trylaminophenyl)propane;
1,1-bis(4-di-p-trylaminophenyl)cyclohexane;
N,N,N',N'-tetra-p-tryl-4,4'-diaminobiphenyl;
1,1-bis(4-di-p-trylaminophenyl)-4-phenylcyclohexane;
bis(4-dimethylamino-2-methylphenyl)phenylmethane;
bis(4-di-p-trylaminophenyl)phenylmethane;
N,N'-diphenyl-N,N'-di(4-methoxyphenyl)-4,4'-diaminobiphenyl;
N,N,N',N'-tetraphenyl-4,4'-diaminodiphenyl ether;
4,4'-bis(diphenylamino)quadriphenyl;
N,N,N-tri(p-tryl)amine;
4-(di-p-trylamino)-4'-[4-(di-p-trylamino)styryl]stilbene;
4-N,N-diphenylamino-(2-diphenylvinyl)benzene;
3-methoxy-4'-N,N-diphenylaminostilbenzene;
N-phenylcarbazole; compounds containing two condensed aromatic rings in the molecules described in U.S. Pat. No. 5,061,569, e.g.,
4,4'-bis[N-(1-naphthyl)-N-phenylamino]biphenyl(NPD); and
4,4',4"-tris[N-(3-methylphenyl)-N-phenylamino]triphenylamine (MTDATA) having three triphenylamine units linked in a starburst shape, which is described in Japanese Patent Application Laid-Open No. 4-308688.

The electron transport material may be a polymeric material having a main chain partially or fully containing any of the materials mentioned above. Inorganic compounds, such as p-type Si or p-type SiC, can also be used as a hole injecting material and a hole transport material.

Alternatively, the electron transport material may be a p-type hole transport material, such as that described in Japanese Patent Application Laid-Open No. 11-251067 or J. Huang et al., Applied Physics Letters, 80 (2002), p. 139. According to one or more embodiments of the invention, the materials mentioned above may be used for the production of high efficiency luminescent element.

The hole transport layer is formed by deposition of the hole transport material through a known thin film deposition process, such as vacuum vapor deposition, spin coating, casting, printing procedures including inkjet printing, and LB method. The hole transport layer may have any thickness, typically in the range of 5 nm to 5 µm, or 5 to 200 nm. The hole transport layer may have a single-layer configuration composed of at least one of the above-mentioned materials.

The material for the hole transport layer may be doped with impurities to increase the positive charge therein. Examples of such doped materials are described in Japanese Patent Application Laid-Open Nos. 4-297076, 2000-196140, and 2001-102175, and J. Appl. Phys., 95, 5773 (2004).

An increase in the positive charge in the hole transport layer may be employed for the production of an element having low power consumption.

(4) Electron Transport Layer

The electron transport layer is composed of an electron transport material that can transport electrons. The electron injecting layers and hole blocking layers (not shown) are also categorized into electron transport layers in a broad sense.

The electron transport layer may have a single-layer or multilayer configuration.

The electron transport layer having a single-layer or multilayer configuration includes a single layer or a layer adjoining a light emitting layer that may be composed of an electrode transport material (also serving as a hole blocking material) that transfers electrons injected from the cathode into the light emitting layer. The electron transport material may be selected from known compounds. Examples of such compounds include derivatives of nitro-substituted fluorene, diphenylquinone, and thiopyran dioxide; carbodiimide; and derivatives of fluorenylidene methane, anthraquinodimethane, anthrone, and oxadiazole. The electron transport material may also be a thiadiazole derivative, which is an oxadiazole derivative having an oxadiazole ring containing an oxygen atom replaced with a sulfur atom, or a quinoxaline derivative having a quinoxaline ring, which is known as an electron attractive group. The electron transport material may be a polymeric material having a main chain partially or fully containing any of the materials mentioned above.

Other examples of the material for the electron transport layer include metal complexes of 8-quinolinol derivatives, for example, tris(8-quinolinol)aluminum (Alq3), tris(5,7-dichloro-8-quinolinol)aluminum, tris (5,7-dibromo-8-quinolinol)aluminum, tris(2-methyl-8-quinolinol)aluminum, tris(5-methyl-8-quinolinol)aluminum, and bis(8-quinolinol) zinc (Znq); and metal complexes having a central metal replaced with In, Mg, Cu, Ca, Sn, Ga, or Pb.

Examples of other materials for the electron transport layer include metal or metal-free phthalocyanines, and metal or metal-free phthalocyanines having terminals replaced with alkyl groups and/or sulfonate groups. Distyrylpyrazine derivatives, which are examples of the materials for the light emitting layer, may also be used as materials for the electron transport layer. Alternatively, inorganic semiconductors, such as n-type Si and n-type SiC, may be used as materials for the electron transport layer, similar to those of the hole injecting layer and the hole transport layer.

The electron transport layer is formed by deposition of the materials described above through a known thin-film deposition process, such as vacuum vapor deposition, spin coating, casting, printing procedures including inkjet printing, and LB method. The electron transport layer may have any thickness, typically in the range of 5 nm to 5 µm, or 5 to 200 nm. The electron transport layer may have a single-layer configuration composed of at least one of the above-mentioned materials.

The electron transport layer may be doped with impurities to increase the negative charge therein. Examples of such doped materials are described in Japanese Patent Application Laid-Open Nos. 4-297076, 10-270172, 2000-196140, and 2001-102175, and J. Appl. Phys., 95, 5773 (2004). The electron transport layer may contain potassium or potassium compounds. An example of a potassium compound is potassium fluoride. An increase in the negative charge in the electron transport layer may be employed for the production of an element having low power consumption.

The material (electron transportable compound) for the electron transport layer may be the same as the materials for the primary layer described above. The material for an electron transport layer that also serves as an electron injecting layer may also be the same as that of the primary layer described above.

(5) Blocking Layer (Hole Blocking Layer, Electron Blocking Layer)

A further organic functional layer, i.e., a blocking layer may be provided, in addition to the functional layers described above. Examples of blocking layers include the hole blocking (hole blocking) layers described in Japanese Patent Application Laid-Open Nos. 11-204258 and 11-204359, and "Yuuki EL soshi to sono kougyouka saizensen (Organic EL Devices and the Forefront of Their Industrialization)" (Nov. 30, 1998, NTS Inc., p. 237).

The hole blocking layers are categorized into electron transport layers in a broad sense. The hole blocking layer is composed of a hole blocking material that can transport electrons and a significantly limited number of positive holes. The transportation of electrons and the blocking of positive holes increase the recombination rate of the electrons and the positive holes. The layer configuration of the electron transport layer described below may be applied to the hole blocking layer according to one or more embodiments of the invention, if necessary. The hole blocking layer may be disposed adjacent to the light emitting layer.

The electron blocking layers are categorized into hole transport layers in abroad sense. The electron blocking layer is composed of a material that transports holes and a significantly limited number of electrons. The transportation of holes and the blocking of electrons increase the recombination rate of the electrons and the positive holes. The layer configuration of the hole transport layer described below may be applied to the electron blocking layer according to one or more embodiments of the invention, if necessary. The hole blocking layer according to the one or more embodiments of invention may have a thickness within the range of 3 to 100 nm, or 5 to 30 nm.

<<Second Electrode>>

The second electrode is in a form of an electrode film functioning as a cathode supplying electrons to the organic functional layer and is composed of metals, alloys, organic or inorganic conductive compounds, or mixtures thereof. Specific examples of the material for the electrode include aluminum, silver, magnesium, lithium, mixtures of magnesium and copper, mixtures of magnesium and silver, mixtures of magnesium and aluminum, mixtures of magnesium and indium, indium, mixtures of lithium and aluminum, rare-earth metals, and oxide semiconductors, such as ITO, ZnO, $TiO_2$, and $SnO_2$.

The second electrode can be prepared as a thin film formed through deposition or sputtering of a conductive material. The sheet resistance of the second electrode may be several hundreds of Ω/square or less. The thickness of the second electrode is typically within the range of 5 to 5000 nm, or 5 to 200 nm.

If the organic EL element emits light from the second electrode, the second electrode may be composed of a material having high light transmittance selected among the conductive materials described above. In such a case, the method of patterning can be carried out through light radiation from the side adjacent to the second electrode.

<<Extraction Electrode>>

An extraction electrode electrically connects the first electrode and an external power supply. The extraction electrode may be composed of any known suitable material, e.g., metal films such as a triple layer MAM electrode ((Mo)/(alloy of Al and Nd)/(Mo)).

<<Auxiliary Electrode>>

An auxiliary electrode is disposed in contact with the first electrode so as to lower the resistance of the first electrode. A material for the auxiliary electrode may be a low-resistance metal, e.g. gold, platinum, silver, copper, and aluminum. Such a metal has low light transmittance. Thus, the auxiliary electrode is patterned in such a manner without influence on the light extraction from the light-extraction surface.

Examples of patterning procedures of such an auxiliary electrode include vacuum vapor deposition, sputtering, printing, inkjet printing, and aerosol jet printing. A line width of the auxiliary electrode may be 50 μm or less, in view of the opening rate of the extracted light. The thickness of the auxiliary electrode may be 1 μm or more, in view of conductivity.

<<Sealant>>

A sealant covers the body of the organic EL element (organic functional layer, various electrodes, and lines) on the substrate. The sealant may be in the form of a plate (film) and fixed to the substrate with an adhesive or may be a sealing film. Either type of sealant seals the organic EL element with partial exposure of the first electrode, the second electrode, and the extraction electrode.

The sealant in the form of a plate (film) may have a depression on one side, i.e., be in the form of a concave plate, or have a flat surface, i.e., be in the form of a flat plate. A (concave or flat) sealant plate is disposed on the body of the organic EL element disposed on the opposite side of the substrate 1.

Examples of the sealants include transparent substrates, such as glass plates, polymer plates, and metal plates. A substrate in the form of a glass plate may be composed of materials including alkali-free glass, soda-lime glass, glass containing barium and strontium, lead glass, aluminosilicate glass, borosilicate glass, barium borosilicate glass, and quartz. A substrate in the form of a polymer plate may be composed of materials including polycarbonates, acrylic resins, poly(ethylene terephthalate), polyether sulfide, and polysulfone. A substrate in the form of a metal plate may be composed of at least one metal or alloy selected from stainless steel, iron, copper, aluminum, magnesium, nickel, zinc, chromium, titanium, molybdenum, silicon, germanium, tantalum, and alloys thereof.

If a concave sealant plate is used (if capping is performed), the gap between the sealant and the body of the organic EL element (organic functional layers, electrodes, and lines) may be filled with inert gas, such as nitrogen and argon, or inert liquid, such as fluorohydrocarbon and silicone oil. Alternatively, the gap between the sealant and the body of the organic EL element may be a vacuum or filled with a hygroscopic compound.

If a flat plate sealant is used, the sealant and the substrate 1 are bonded with a photo-curable or thermally curable adhesive containing reactive vinyl groups of acrylate oligomers or methacrylate oligomers, or a moisture curable adhesive, such as 2-cyanoacrylate adhesive. Alternatively, the adhesive may be thermally curable or chemically curable (two-component) adhesive, such as an epoxy adhesive.

Alternatively, the sealant may be in the form of a sealing film, as described above.

The sealing film may be composed of an inorganic or organic material. The sealing film may be composed of a material that prevents the intrusion of substances that cause degradation in the organic functional layer, such as water or oxygen. Examples of such a material include inorganic materials, such as silicon oxide, silicon dioxide, and silicon nitride. The fragility of the sealing film can be reduced through a multilayer configuration of films composed of inorganic and organic materials.

Examples of procedures of forming the sealing film described above include vacuum vapor deposition, sputtering, reactive sputtering, molecular beam epitaxy, cluster ion beam method, ion plating, plasma polymerization, atmospheric-pressure plasma polymerization, plasma CVD, laser CVD, thermal CVD, and coating.

<<Protective Film, Protective Plate>>

The organic EL element may further include a protective film or plate disposed on the sealant.

The protective film or plate is disposed on the substrate with the body of the organic EL element (organic functional layer, various electrodes, and lines) and the sealant disposed therebetween, and mechanically protects the body of the organic EL element. In particular, if the sealant is in the form of a sealing film, a protective film or plate may be used to enhance the insufficient mechanical protection of the body of the organic EL element provided by the sealing film.

Examples of the protective film or plate include a glass plate, a polymer plate, a thin polymer film, a metal plate, a thin metal film, and a film composed of a polymeric material or a metallic material. Among these examples, the polymer film may be used in view of reduction of weight and thickness of the element.

INDUSTRIAL APPLICABILITY

As described above, one or more embodiments of the invention can provide a method of patterning an organic electroluminescent element that can form a precise emission pattern having a predetermined gradation of emission luminance levels.

EXPLANATION OF REFERENCE NUMERALS 1 pattern forming device
2 organic EL element
11 semiconductor laser light source (LD light source)
12 collimator lens
13 condenser lens
14 beam splitter
15 light detector
16 reflecting mirror
17 adjuster
18 controller Although the disclosure has been described with respect to only a limited number of embodiments, those skilled in the art, having benefit of this disclosure, will appreciate that various other embodiments may be devised without departing from the scope of the invention. Accordingly, the scope of the invention should be limited only by the attached claims.

The invention claimed is:

1. A method comprising:
   forming an emission pattern on an organic electroluminescent element comprising an organic functional layer between two electrodes by light irradiation to the organic electroluminescent element; and
   controlling at least one of a light intensity of the light irradiation and an exposure time of the light irradiation as variable factors based on a reciprocity failure characteristic of the organic functional layer due to the light irradiation,
   wherein the reciprocity failure characteristic specifies that a modification of the organic functional layer is not constant for a constant cumulative light irradiation of the organic functional layer based on the light intensity of the light irradiation and the exposure time of the light irradiation.

2. The method according to claim 1, wherein
   the controlling of the at least one of light intensity and exposure time is based on the reciprocity failure characteristics determined through preliminary measurements of a mutual relationship between the level of the modification of the function of the organic functional layer due to the light irradiation and the at least one of light intensity and exposure time.

3. The method according to claim 1, wherein
   the modification of the function of the organic functional layer due to the light irradiation corresponds to a variation in emission luminance of the organic electroluminescent element.

4. The method according to claim 1, wherein
   the controlling comprises keeping the exposure time constant and varying the light intensity.

5. The method according to claim 1, wherein
   the controlling comprises keeping the light intensity constant and varying the exposure time.

6. The method according to claim 1, wherein
   the emission pattern is formed through stippling by the light irradiation.

7. The method according to claim 1, wherein
   the emission pattern is formed by the light irradiation through a patterning mask to adjust the light intensity.

8. The method according to claim 2, wherein the modification of the function of the organic functional layer due to the light irradiation corresponds to a variation in emission luminance of the organic electroluminescent element.

9. The method according to claim 2, wherein the controlling comprises keeping the exposure time constant and varying the light intensity.

10. The method according to claim 3, wherein the controlling comprises keeping the exposure time constant and varying the light intensity.

11. The method according to claim 8, wherein the controlling comprises keeping the exposure time constant and varying the light intensity.

12. The method according to claim 2, wherein the controlling comprises keeping the light intensity constant and varying the exposure time.

13. The method according to claim 3, wherein the controlling comprises keeping the light intensity constant and varying the exposure time.

14. The method according to claim 8, wherein the controlling comprises keeping the light intensity constant and varying the exposure time.

15. The method according to claim 2, wherein the emission pattern is formed through stippling by the light irradiation.

16. The method according to claim 3, wherein the emission pattern is formed through stippling by the light irradiation.

17. The method according to claim 4, wherein the emission pattern is formed through stippling by the light irradiation.

18. The method according to claim 5, wherein the emission pattern is formed through stippling by the light irradiation.

19. The method according to claim 8, wherein the emission pattern is formed through stippling by the light irradiation.

20. The method according to claim 1, further comprising:
    determining a relationship between the light intensity of the light irradiation and the exposure time of the light irradiation for forming the emission pattern, wherein the relationship corresponds to a variation in an emission luminance level of the organic electroluminescent element modified by the light irradiation.

* * * * *